United States Patent [19]

Kobayashi et al.

[11] Patent Number: 4,948,482
[45] Date of Patent: Aug. 14, 1990

[54] METHOD FOR FORMING SILICON NITRIDE FILM

[75] Inventors: Masato Kobayashi; Yoichi Yamaguchi, both of Tokyo, Japan

[73] Assignee: Hoya Corporation, Tokyo, Japan

[21] Appl. No.: 287,017

[22] Filed: Dec. 21, 1988

[30] Foreign Application Priority Data

Dec. 29, 1987 [JP] Japan .................................. 62-333733

[51] Int. Cl.$^5$ .......................................... C23C 14/34
[52] U.S. Cl. ................................ 204/192.23; 437/241
[58] Field of Search .................... 204/192.23; 437/241; 428/428, 446

[56] References Cited

FOREIGN PATENT DOCUMENTS

| 59-114829 | 7/1984 | Japan | 437/241 |
| 60-12737 | 1/1985 | Japan | 437/241 |
| 62-81033 | 4/1987 | Japan | 437/241 |
| 63-132433 | 6/1988 | Japan | 437/241 |

OTHER PUBLICATIONS

S. M. Hu et al., *J. Electrochem. Soc.*, vol. 114, pp. 826–833 (1967).

*Primary Examiner*—Aaron Weisstuch
*Attorney, Agent, or Firm*—Nixon & Vanderhye

[57] ABSTRACT

Silicon nitride films are formed by controlling the internal stress more precisely than conventional methods without varying its optical properties, mechanical strength, composition and density. The film is formed by sputtering, using an inert gas or a mixture of an inert gas and nitrogen, onto a substrate while keeping the substrate temperature within a given temperature range according to the pressure of the sputtering gas or gas mixture, the two being interrelated, thus carefully and precisely controlling the internal stress of the film formed.

7 Claims, 2 Drawing Sheets

METHOD FOR FORMING SILICON NITRIDE FILM

BACKGROUND OF THE INVENTION

1. Field of the Invention

The present invention relates to a method for forming a silicon nitride film used as, for example, a protective film for semiconductor chips or memory disks and an X-ray transmission film. More particularly, the present invention relates to a method for forming a silicon nitride films with a highly controlled internal stress.

2. Description of the Prior Art

Conventionally, the CVD method and the sputtering method have often been used for formation of a silicon nitride film. The silicon nitride film formed by the CVD method, however, has had the following drawbacks. Firstly, there are used, as the raw material gases, a silicon compound such as a silicon hydride (e.g. silane $SiH_4$), a silicon fluoride (e.g. $SiF_4$) or a silicon chloride (e.g. $SiCl_4$), ammonia ($NH_3$) and nitrogen ($N_2$); that is, the easily decomposable raw material gases contain not only silicon and nitrogen which are constituent elements of silicon nitride ($Si_xN_y$) but also other elements; consequently, the silicon nitride films formed by the CVD method inevitably contains impurities in principle. The silicon nitride films containing impurities besides silicon and nitrogen largely vary in internal stress depending upon the content of the impurities. In order to precisely control the impurities content in the silicon nitride films, it is necessary to always make the film formation (deposition) conditions constant; that is, in the thermal CVD method, for example, it is required to always make constant the deposition temperature, gas composition, gas flow rate and gas pressure. In the plasma CVD method, not only the deposition temperature, gas composition, gas flow rate and gas pressure but also the plasma state must be made constant. To always keep these parameters constant is extremely difficult and the impurities content in the silicon nitride cannot be kept constant. Thus, the precise control of internal stress of silicon nitride films has been impossible in the CVD method. Secondly, the impurities in the silicon nitride films significantly reduce the chemical stability of the films. For example, in the substrate dissolution step in the production of an X-ray lithography mask using a silicon nitride film as an X-ray transmission film, the partial dissolution of the silicon nitride film takes place, thereby allowing the film to have flaws. Further, the impurities in silicon nitride films are easily eliminated by the application of an ionizing radiation, thereby causing a change in the composition, optical transparency and physical properties of the film.

Meanwhile, the conventional sputtering method for forming silicon nitride films has had the following problems. Firstly, in the conventional sputtering method, the internal stress of the silicon nitride films is controlled by the pressure of the sputtering gas used. In this case, the precise control of the internal stress is impossible because the internal stress is greatly changed even by the slight change of the gas pressure, and the control of the internal stress has been possible only in the order of, for example, about $10 \times 10^8$ dyn/cm$^2$. Secondly, the gas pressure must be fairly large (at least 10 Pa) in order for the internal stress to be a tensile stress; use of a large gas pressure incurs trapping of impurities (e.g. hydrogen, oxygen) in silicon nitride; these impurities significantly reduce the chemical stability of the silicon nitride film obtained. For example, in the substrate dissolution step in the production of an X-ray lithography mask using a silicon nitride film as an X-ray transmission film, partial dissolution of the silicon nitride film takes place, thereby allowing the film to have flaws. Further, the impurities in silicon nitride films are easily eliminated by the application of an ionizing radiation, thereby causing a change in the composition, optical transparency and physical properties of the films.

As stated above, in conventional methods for forming a silicon nitride film, it has been very difficult to control the internal stress of the film.

SUMMARY OF THE INVENTION

An object of the present invention is to provide a method for forming a silicon nitride film with a highly controlled internal stress.

Other objects will be apparent from the following description and drawings.

The present invention resides in a method for forming a silicon nitride film which comprises depositing a silicon nitride film on a substrate by a sputtering method using, as a sputtering gas, an inert gas or a mixed gas of an inert gas and nitrogen gas, said method further comprising, during the deposition of said silicon nitride film, keeping the substrate temperature at a given temperature range appropriate for the pressure of the sputtering gas to control the internal stress of the film formed.

DETAILED DESCRIPTION OF THE INVENTION

The present invention utilizes the fact that in depositing a silicon nitride film on a substrate by a sputtering method using, as a sputtering gas, an inert gas or a mixed gas of an inert gas and nitrogen gas, the internal stress of the film formed can be controlled by keeping the substrate temperature at a given temperature range appropriate for the pressure of the sputtering gas used.

In the present method, the substrate temperature can be controlled precisely and the change of the internal stress of the silicon nitride film as a function of the change of the substrate temperature is small; therefore, the internal stress of the film can be controlled precisely. Further, the change of the substrate temperature causes no change in properties of the silicon nitride film other than internal stress, such as refractive index, composition, visible light transmission and the like. It is preferred, however, that film deposition be effected at a low sputtering gas pressure in order to prevent the trapping of impurities in the film and at a high substrate temperature in order to obtain a film of high chemical stability.

The present invention is illustrated in more detail by way of Example. However, the present invention is in no way restricted to the Example.

EXAMPLE

A silicon nitride film of 2 μm in thickness was deposited on a silicon substrate by a rf magnetron sputtering method. The sputtering target was a single crystal silicon target. The sputtering gas was a mixed gas of Ar gas (an inert gas) and $N_2$ gas. The flow rate of this mixed gas was constant (Ar gas flow rate=12.0 sccm (cc at standard condition/min), $N_2$ gas flow rate=4.0 sccm, ratio of $N_2$ gas to total gas flow rate ($N_2/(Ar+N_2)$)=0.25). The internal stress of silicon nitride film was controlled by the control of the substrate temperature. In this Example, the control of the substrate temperature was made by fixing an electric heating wire to a plate for holding the substrate so as to ensure uniform heating of the substrate and supplying an electric current to the heating wire. The rf power was constant at 16.72 W/cm$^2$ but there were employed various sputtering gas pressures, i.e. 0.4 Pa, 0.5 Pa, 0.6 Pa, 0.65 Pa, 0.7 Pa, 0.8 Pa and 1.0 Pa.

Figure 1:
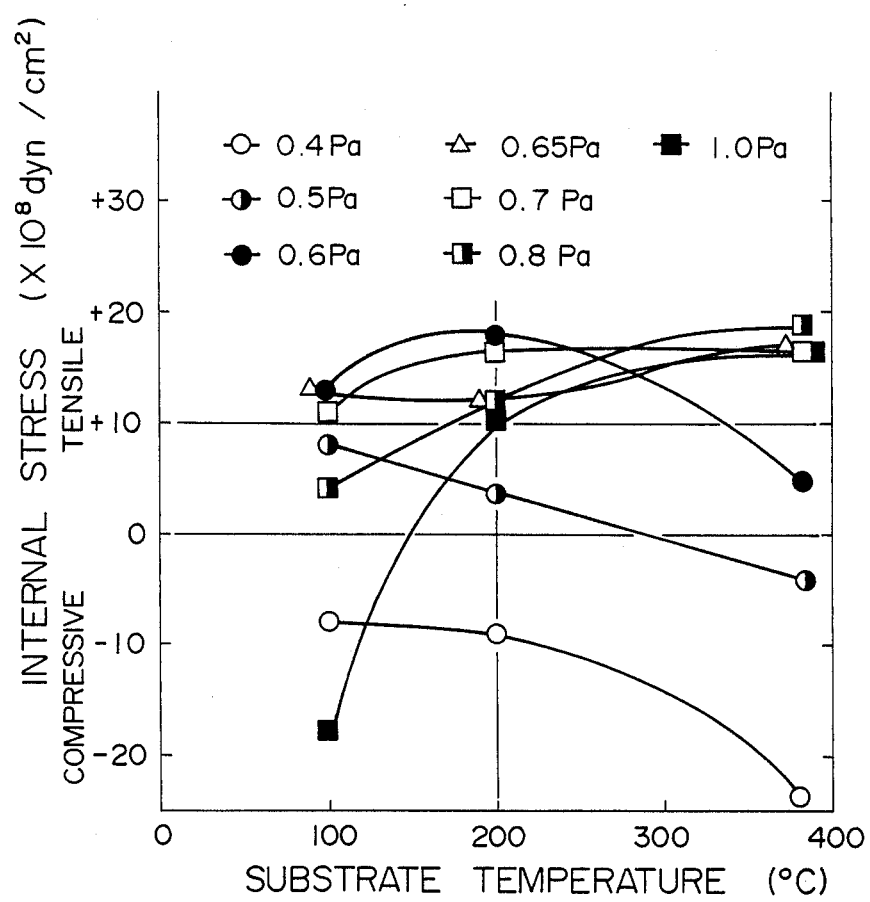
FIG. 1 is a graph showing the change of the internal stress of a silicon nitride film as a function of the change of the substrate temperature in the Example of the present invention.

The change of internal stress of silicon nitride film by the change of substrate temperature is shown in FIG. 1. Incidentally, the internal stress was measured by the Newton rings method.

In the case of sputtering gas pressure=0.4 Pa, the internal stress was a compressive stress at a substrate temperature of 100° C.; and the compressive stress increased gradually as the substrate temperature was increased. In the case of sputtering gas temperature =0.5 Pa, the internal stress was a tensile stress at a substrate temperature of 100° C.; the tensile stress decreased gradually as the substrate temperature was increased: and the internal stress transform from a tensile stress to a compressive stress at a substrate temperature of 290° C. The compressive stress showed a gradual increase with the further increase of the substrate temperature. In this case of 0.5 Pa, since the internal stress changes linearly with the change of the substrate temperature, the internal stress can be controlled at a precision of 0.5x10$^8$ dyn/cm$^2$ for a substrate temperature change of 10° C. In the case of sputtering gas pressure=0.6 Pa, the internal stress was a tensile stress at a substrate temperature of 100° C.; the tensile stress increased gradually as the substrate temperature was increased and became a maximum at a substrate temperature of 200° C; and with the further increase of the substrate temperature, the tensile stress decreased gradually. In the case of sputtering gas pressure=0.8 Pa, the internal stress was a tensile stress at a substrate temperature of 100° C.; and the tensile stress increased gradually as the substrate temperature was increased. As seen from the above, the change of internal stress as a function of the change of substrate temperature differs according to the pressure level of the sputtering gas employed. As is clear from FIG. 1, however, the change of internal stress as a function of the change of substrate temperature is very small when the sputtering gas pressure, is less than 1.0 Pa. Accordingly, the control of internal stress by the change of substrate temperature provides an excellent method for the control of internal stress. Moreover, the internal stress obtained by this method has an excellent reproducibility.

As is clear from FIG. 1, when the sputtering gas pressure is 1.0 Pa, the internal stress changes more diamatically as a function of the change of substrate temperature than when the sputtering gas pressure is less than 1.0 Pa, making the control of internal stress by the control of substrate temperature more difficult. Nevertheless, the above control of internal stress by the control of substrate temperature is far superior to the conventional methods for the control of internal stress by, for example, sputtering gas pressure alone.

The silicon nitride film formed by the above sputtering method can be used as an X-ray transmission film for an X-ray lithography mask. This X-ray transmission film preferably has an internal stress of 10.0x10$^8$ dyn/cm$^2$ or less in terms of tensile stress. According to FIG. 1, the preferable substrate temperature range which enables the production of a silicon nitride film (an X-ray transmission film) having an internal tensile stress of 10.0x10$^8$ dyn/cm2 or less is about 100° C. to about 290° C. in the case of sputtering gas pressure=0.5 Pa, about 340° C. to about 380° C. in the case of sputtering gas pressure=0.6 Pa, and about 100° C. to about 170° C. in the case of sputtering gas pressure=0.8 Pa. Especially in the case of sputtering gas pressure=0.5 Pa, the internal stress can be controlled at 5x10$^8$ dyn/cm$^2$ or less in terms of tensile stress over a wide substrate temperature range of 200–290° C.; the change of internal stress as a function of the change of substrate temperature is linear; and the internal stress can be controlled at a precision of 0.5x10$^8$ dyn/cm$^2$ for a substrate temperature change of 10° C. Hence, the sputtering gas pressure is most preferably 0.5 Pa or its vicinity (e.g. 0.45–0.55 Pa) when the silicon nitride film formed is used as an X-ray transmission film.

Figure 2:
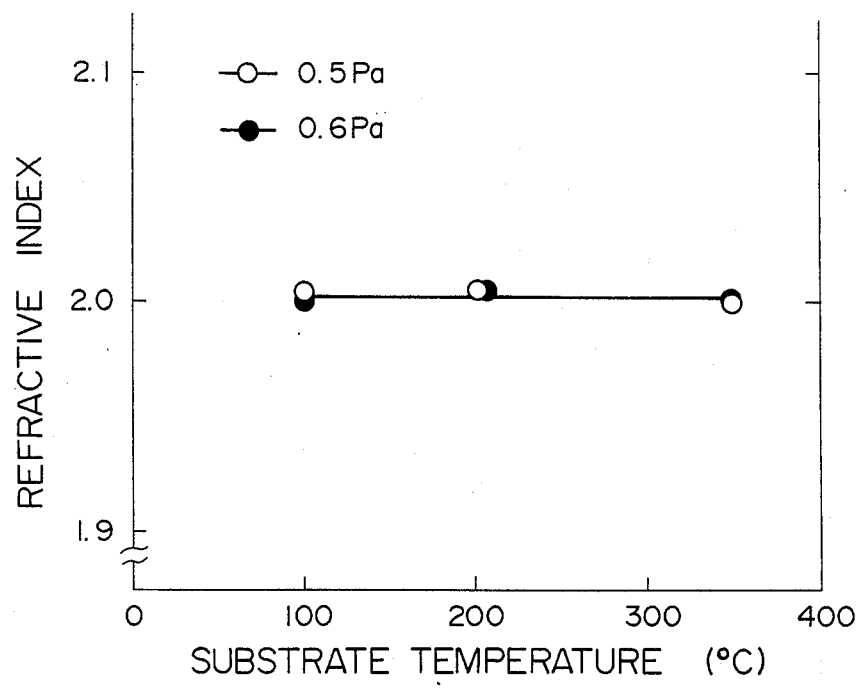
FIG. 2 is a graph showing the change of the refractive index of a silicon nitride film as a function of the change of the substrate temperature in the Example of the present invention.

Shown in FIG. 2 is the change of refractive index of silicon nitride film as a function of the change of substrate temperature. As seen in FIG. 2, the refractive index of silicon nitride film has substantially no dependency on the substrate temperature and was 2.0 for both cases of sputtering gas pressure=0.5 Pa 0.6 Pa. In addition, these silicon nitride films were transparent in the visible region.

The Fourier transform infrared absorption spectra of the above silicon nitride films confirmed that the films contained no impurities. Therefore, when the films are applied to an X-ray lithography mask, there occurs no mask strain, no compositional change, no reduction in optical transparency and no change in physical properties by the application of an ionizing radiation.

When film formation was conducted at substrate temperatures of 200° C. or more, the resulting films showed significant improvement of chemical stability as well as improvement of optical property and mechanical strength. The silicon nitride sample formed at a substrate temperature of 100° C. and the silicon nitride sample formed at a substrate temperature higher than 200° C. were immersed in a 50% NaOH solution at 100° C. for 3 hours; the former sample dissolved partially followed by film breakage while the latter sample saw no change. Hence, in order to obtain a silicon nitride film with satisfactory internal stress and chemical stability, the preferable substrate temperature is 200° C. to 290° C. in the case of 0.5 Pa and 340° C. to 380° C. in the case of 0.6 Pa.

In the above method for the control of internal stress of silicon nitride films by the control of substrate temperature, the properties of the formed films other than chemical stability, for example, the film composition and density, were confirmed to exhibit no change.

The above Example can be modified as follows.

In the above Example, the Si target was used as a sputtering target and the mixed gas of Ar gas and $N_2$ gas was used as a sputtering gas. It is possible to use, as a sputtering target, a $Si_xN_y$ target of desired composition and, as a sputtering gas, only an inert gas such as Ar gas or the like. It is also possible to use a substrate other than Si substrate, i.e. a SiO$_2$ substrate (glass wafer).

The present method for forming films silicon nitride film can control the internal stress of the formed silicon nitride more precisely than the conventional methods.

Further, the present method can effect the precise control of the internal stress of the films without varying the optical properties, mechanical strength, composition and density. Accordingly, the present method has excellent practical uses.

The silicon nitride films obtained by the present method are transparent in a visible region and have excellent chemical stability and mechanical strength, and therefore are suitable for use as an X-ray transmission film for X-ray lithography mask.

The above-described embodiments are just an example of the present invention, and therefore, it will be apparent for those skilled in the art that many modifications and variations may be made without departing from the scope of the present invention.

What is claimed is:

1. A method for forming a silicon nitride film which comprises depositing a silicon nitride film having a preselected amount of internal stress on a substrate by a sputtering method using, as a sputtering gas, an inert gas or a mixed gas of an inert gas and nitrogen gas, said method further comprising, during the deposition of said silicon nitride film, keeping the substrate temperature at a given temperature range according to the pressure of the sputtering gas to control the internal stress of the film formed substantially to said preselected amount.

2. A method according to claim 1, wherein the substrate temperature is kept in the range of about 100° C. to 400° C. when the pressure of the sputtering gas is less than 1.0 Pa.

3. A method according to claim 2, wherein the pressure of the sputtering gas is 0.5 Pa or its vicinity.

4. A method according to claim 2, wherein the range of the substrate temperature is about 100° C. to about 290° C. in the case of the pressure of sputtering gas of 0.5 Pa, about 340° C. to about 380° C. in the case of the pressure of the sputtering gas of 0.6 Pa and about 100° C. to about 170° C. in the case of the pressure of the sputtering gas of 0.8 Pa.

5. A method according to claim 4, wherein the substrate temperature is in the range of 200° C. to 290° C. in the case of the pressure of the sputtering gas of 0.5 Pa.

6. A method according to claim 1, wherein said substrate is a Si substrate or a SiO$_2$ substrate.

7. A method of forming a silicon nitride film on an Si or SiO$_2$ substrate and carefully controlling the internal stress of the silicon nitride film so formed to a preselected value, comprising sputtering, using an inert gas or a mixture of an inert gas and nitrogen gas, as the sputtering gas, wherein during sputtering, while the silicon nitride film is being formed, maintaining the substrate at a temperature in the range of about 100° C. to 400° C. and the pressure of the sputtering gas less than 1.0 Pa and thereby controlling the internal stress of the silicon nitride film thus formed substantially to said preselected value.

* * * * *